(12) United States Patent
Takagi

(10) Patent No.: US 6,845,205 B2
(45) Date of Patent: Jan. 18, 2005

(54) SEMICONDUCTOR OPTICAL DEVICE

(75) Inventor: Kazuhisa Takagi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 313 days.

(21) Appl. No.: 10/251,832

(22) Filed: Sep. 23, 2002

(65) Prior Publication Data

US 2003/0107108 A1 Jun. 12, 2003

(30) Foreign Application Priority Data

Dec. 7, 2001 (JP) ................................ P 2001-374403

(51) Int. Cl.⁷ .......................... G02B 6/00; G02B 6/10; H01L 29/06; H01L 27/15
(52) U.S. Cl. ....................... 385/131; 385/141; 257/623
(58) Field of Search ............................. 385/129–132, 385/141, 147, 3, 40, 41; 257/623, 80

(56) References Cited

U.S. PATENT DOCUMENTS

| | | | |
|---|---|---|---|
| 5,347,601 A | * | 9/1994 | Ade et al. ...................... 385/3 |
| 2004/0052443 A1 | * | 3/2004 | Heaton et al. ................. 385/3 |
| 2004/0081389 A1 | * | 4/2004 | Soda et al. .................... 385/16 |
| 2004/0119079 A1 | * | 6/2004 | Hayakawa et al. ........... 257/80 |

FOREIGN PATENT DOCUMENTS

JP 9-232681 9/1997

* cited by examiner

Primary Examiner—Akm Enayet Ullah
(74) Attorney, Agent, or Firm—Leydig, Voit & Mayer, Ltd.

(57) ABSTRACT

A waveguide semiconductor optical device with a mesa ridge structure includes a semi-insulating substrate; and a ridge on the semi-insulating substrate, and including a lower cladding layer, a core layer, and an upper cladding layer sequentially laminated on the semi-insulating substrate, wherein the lower cladding layer includes a first laterally extending from the ridge and having an electrode on a top face, and a second layer with a carrier density lower than that of the first layer and in contact with the core layer.

7 Claims, 6 Drawing Sheets

SEMICONDUCTOR OPTICAL DEVICE

CROSS-REFERENCE TO RELATED APPLICATIONS

A related patent application is a commonly assigned Japanese Patent Application No. 2001-374403 filed on Dec. 7, 2001, which is incorporated by reference into the present patent application.

BACKGROUND OF THE INVENTION

1. Field of the Invention

The present invention relates to a semiconductor optical device for use in optical communications and the like, more particularly to a semiconductor optical device of a high mesa ridge structure using a semi-insulating substrate.

2. Description of the Related Art

Figure 10:
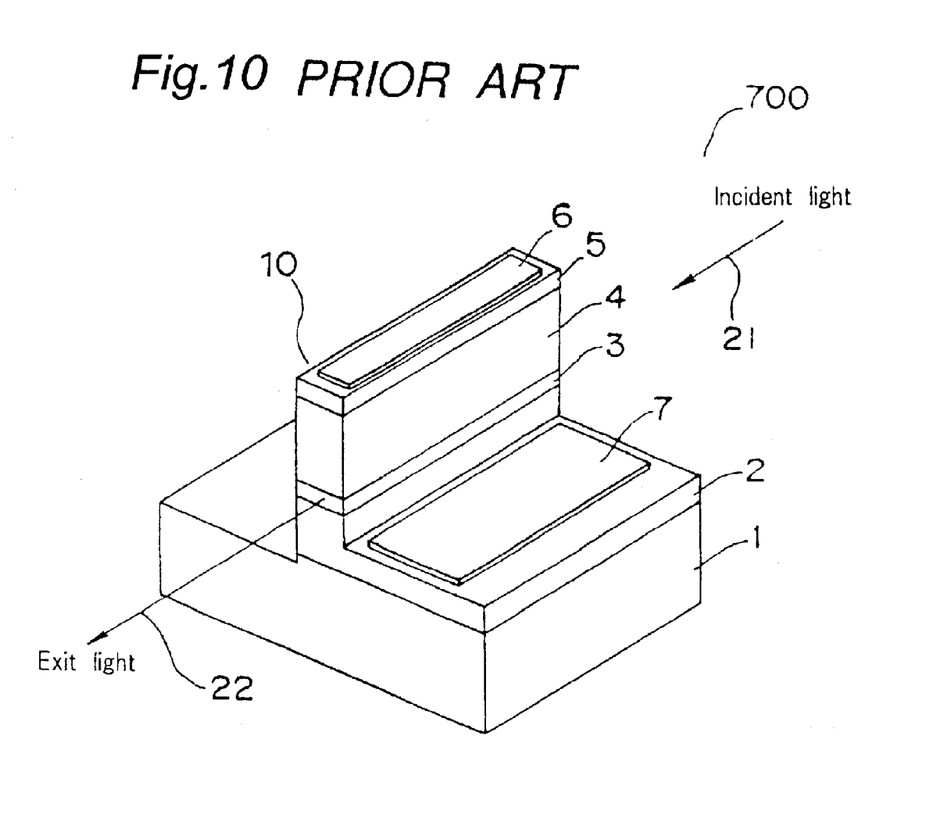
FIG. 10 is a perspective view of a conventional semiconductor optical modulator device.

FIG. 10 is a perspective view of a conventional semiconductor optical modulator device, indicated in its entirety as 700.

The semiconductor optical modulator device 700 includes semi-insulating InP substrate 1. On the substrate 1, an n-InP lower clad layer 2, an InGaAsP light absorption layer 3, a p-InP upper clad layer 4 and a p-InGaAs contact layer 5 are successively laminated one on top of another. The InGaAsP light absorption layer 3 can be a layer of single composition or have a quantum well structure.

From the contact layer 5, the uppermost layer, to the half way of the lower clad layer 2, a ridge 10 is formed by mesa etching (high mesa ridge structure). The lower clad 2 is left on the substrate 1 on one side of the ridge 10.

Provided on the contact layer 5 of the ridge is a Ti/Au anode electrode 6. Provided on the lower clad layer 2 is a Ti/Au cathode electrode 7.

In the semiconductor optical modulator device 700, an incident light 21 enters into the vicinity of the light absorption layer 3 from one end face (on the incident side) and goes out of the other end face (on the exit side) as an exit light 22. When voltage (a modulated electrical signal) is applied between the anode electrode 6 and the cathode electrode 7 in the semiconductor optical modulator device 700, the light absorption coefficient of the light absorption layer 3 of a semiconductor layer varies according to the Franz-Keldysh effect or the Quantum Confined Stark Effect. As a result, the exit light 22 with modulated light intensity is produced at the end face on the exit side.

In order to sufficiently reduce the ohmic junction resistance of cathode electrode 7, the carrier density of the n-InP lower clad layer 2 must be $7 \times 10^{18}$ cm$^{-3}$ or larger.

However, as seen from the following expression (1), the larger the carrier density, the larger the light absorption coefficient (free carrier loss) of the semiconductor (H. C. Casey, Jr. and M. B. Panish "Heterostructure Lasers", Academic Press, (1978), Chapter 3).

$$\alpha_{fc}(\text{cm}^{-1}) \approx (3 \times 10^{-18}) \cdot n + (7 \times 10^{-18}) \cdot p \quad \text{Expression (1)}$$

$\alpha_{fc}$: free carrier loss n and p: densities of electrons and positive holes (unit: cm$^{-3}$)

This fact has posed a problem that the larger the carrier density of the lower clad layer 2, the smaller the intensity of the exit light 22 going out of the semiconductor optical modulator device 700.

SUMMARY OF THE INVENTION

The object of the present invention is to provide a semiconductor optical device of a high mesa ridge structure using a semi-insulating substrate to have excellent ohmic junction and prevent decrease in light intensity.

According to an aspect of the present invention, there is provided a waveguide type semiconductor optical device with a high mesa ridge structure. The device includes a semi-insulating substrate; and a ridge formed on the semi-insulating substrate, including a lower clad layer, core layer and upper clad layer sequentially laminated on the semi-insulating substrate. The lower clad layer includes a high-density layer laterally extending from the ridge and having an electrode placed on a top face thereof, and a low-density layer with a carrier density lower than that of the high-density layer and in contact with the core layer.

According to another aspect of the present invention, there is provided a waveguide type semiconductor optical device with a high mesa ridge structure. The device includes a semi-insulating substrate; and a ridge formed on the semi-insulating substrate, including a lower clad layer, core layer and upper clad layer sequentially laminated on the semi-insulating substrate. The upper clad layer includes a low-density layer in contact with the core layer, and a high-density layer with a carrier density higher than that of the low-density layer.

According to still another aspect of the present invention, there is provided a waveguide type semiconductor optical device with a high mesa ridge structure. The device includes a semi-insulating substrate; and a ridge formed on the semi-insulating substrate, including a lower clad layer, core layer and upper clad layer sequentially laminated on the semi-insulating substrate. The lower clad layer includes a narrow-gap layer with smaller band gap energy laterally extending from the ridge and having an electrode placed on the top face thereof, and a wide-gap layer with band gap energy larger than that of the narrow-gap layer and in contact with the core layer.

DETAILED DESCRIPTION OF THE PREFERRED EMBODIMENTS

Preferred Embodiment 1

Figure 1A:
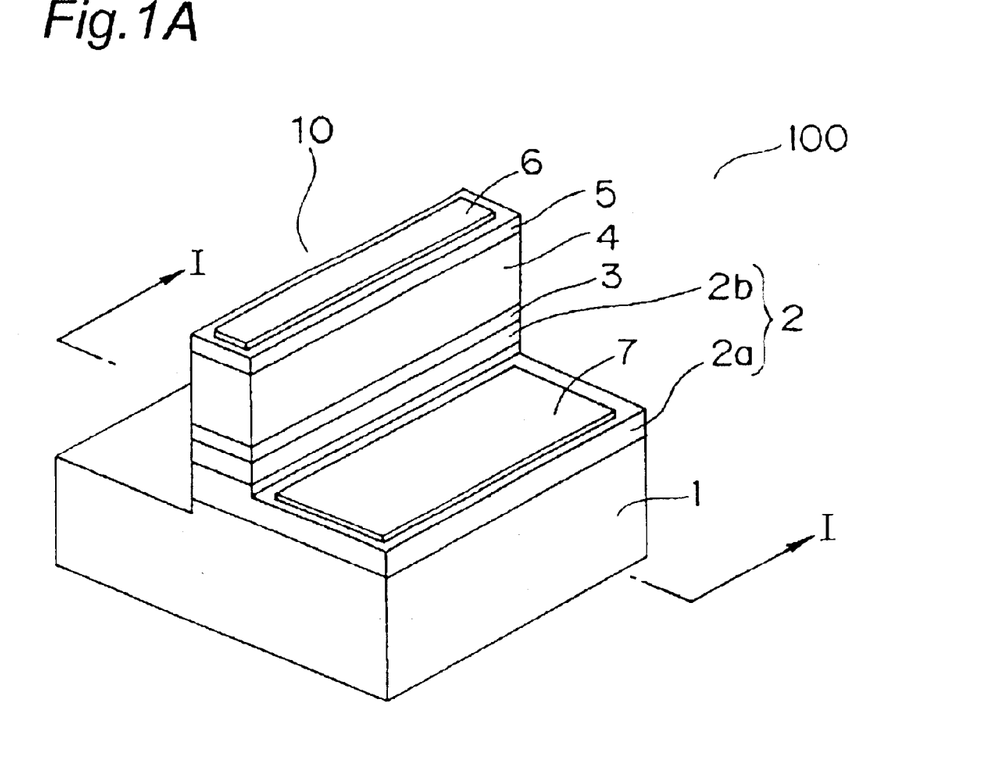
FIG. 1A is a perspective view of a semiconductor optical modulator device in accordance with a first preferred embodiment of the present invention.
Figure 1B:
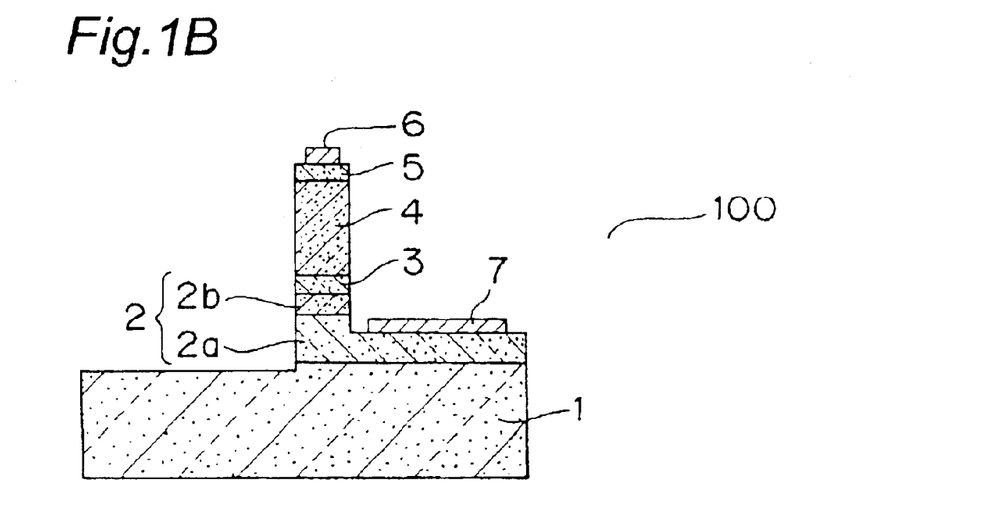
FIG. 1B is a sectional view of the semiconductor optical modulator device in accordance with the first preferred embodiment of the present invention.

FIGS. 1A and 1B illustrate a semiconductor optical modulator device in accordance with this embodiment, indicated in its entirety as 100. FIG. 1A is a perspective view thereof and FIG. 1B is a sectional view taken in the direction of the arrows along the line I—I.

A semiconductor optical modulator device 100 includes a semi-insulating InP substrate 1. On substrate 1, an n-InP lower clad layer 2, an InGaAsP light absorption layer (core layer) 3, a p-InP upper clad layer 4 and a p-InGaAs contact layer 5 are sequentially laminated one on top of another. The InGaAsP light absorption layer 3 can be a layer of single composition or have a quantum well structure.

From the contact layer 5, the uppermost layer, to the half way of the lower clad layer 2, a ridge 10 is formed by mesa etching (high mesa ridge structure). The lower clad layer 2 is left on the substrate 1 on one side of the ridge 10. The width of the ridge 10 is 2 $\mu$m, for example.

Provided on the contact layer 5 is an anode electrode 6 made of Ti/Au. Provided on the lower clad layer 2 is a cathode electrode 7 made of Ti/Au.

In the semiconductor optical modulator device 100 of this embodiment, the lower clad layer 2 further consists of an upper high-density layer 2a and lower low-density layer 2b. As shown in FIGS. 1A and 1B, the high-density layer 2a also extends laterally from the ridge 10. On the other hand, the low-density layer 2b is formed within the ridge 10 only.

Figure 2:
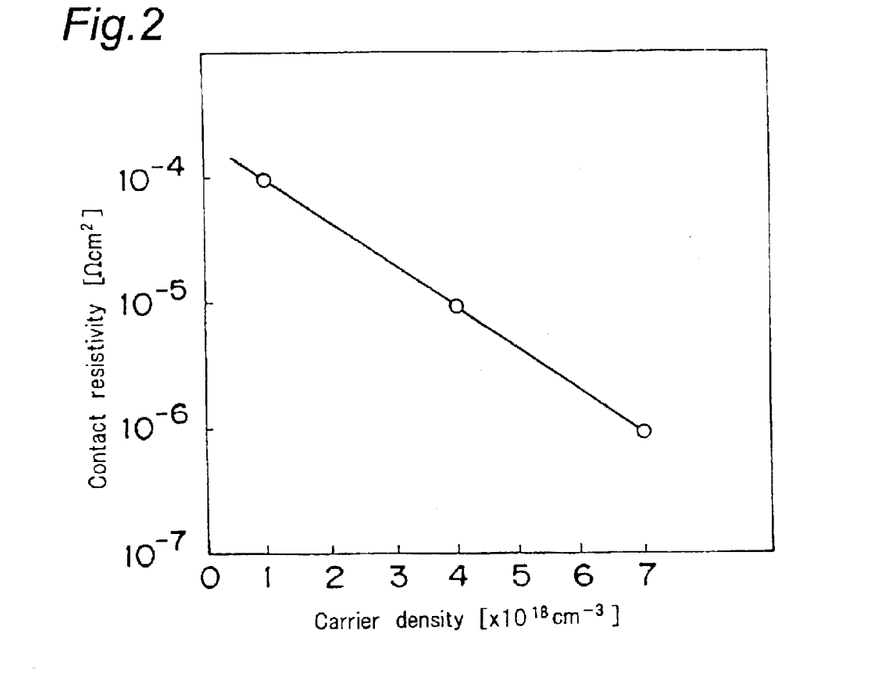
FIG. 2 shows a relation between a carrier density of an InP layer and contact resistivity.

FIG. 2 shows the relation between the carrier density of an n-InP layer and the contact resistivity of an ohmic electrode, when the ohmic electrode is brought into contact with the InP layer. As seen from FIG. 2, in order to attain a contact resistivity of $1 \times 10^{-6}$ $\Omega$cm$^{-2}$, a target figure for excellent ohmic contact of the electrode, the carrier density of the InP layer must be $7 \times 10^{10}$ cm$^{-2}$ or larger. Therefore, it is preferable that the carrier density of the high-density layer 2a in ohmic contact with the cathode layer 7 ranges from $7 \times 10^{18}$ cm$^{-3}$ to $1 \times 10^{19}$ cm$^{-3}$, for example.

On the other hand, according to the above-mentioned expression (1), the carrier density of the low-density layer 2b in contact with the light absorption layer 3 must be $3 \times 10^{17}$ cm$^{-3}$ or smaller, in order to suppress light absorption loss when the light absorption coefficient ($\alpha_{fc}$) is 10 cm$^{-1}$ or lower. For this reason, it is preferable that the carrier density of the low-density layer 2b ranges from $1 \times 10^{17}$ cm$^{-3}$ to $3 \times 10^{17}$ cm$^{-3}$.

Figure 3:
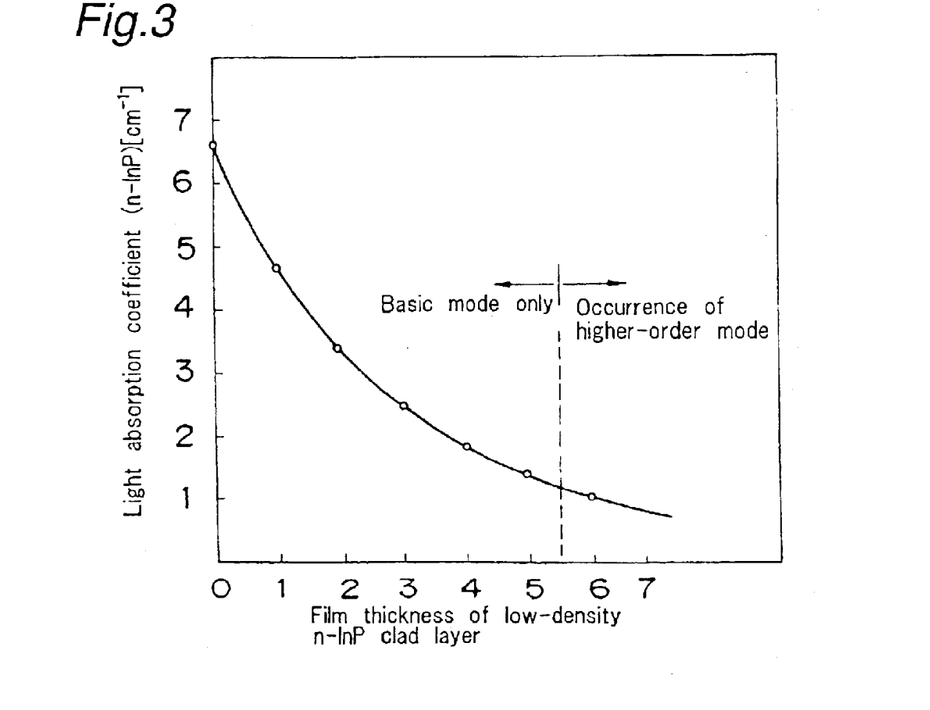
FIG. 3 shows a relation between a film thickness of an InP clad layer and a light absorption coefficient.

FIG. 3 shows the relation between the film thickness of the low-density layer (low-density n-InP clad layer) 2b and the light absorption coefficient in the light guide, in the semiconductor light modulator device 100 shown in FIGS. 1A and 1B. In FIG. 3, the carrier density of the low-density layer 2b is $3 \times 10^{17}$ cm$^{-3}$ and the absorption coefficient is 0.9 cm$^{-1}$, and the carrier density of the high-density layer 2a is $7 \times 10^{18}$ cm$^{-3}$ and the absorption coefficient thereof is 0.9 cm$^{-1}$.

As shown in FIG. 3, when the film thickness of the low-density layer 2b is larger than 0.5 to 0.6 $\mu$m, the light distribution of the light guide moves from the basic mode (single mode) to the higher-order mode. Therefore, in order to obtain the light distribution of the basic mode, the film thickness of the low-density layer 2b must be 0.6 $\mu$m or smaller, preferably 0.5 $\mu$m or smaller.

On the other hand, in order to suppress the light absorption loss in the low-density layer 2b, the light absorption coefficient of the low-density layer 2b must be at least 0.5 cm$^{-1}$ or smaller. Therefore, according to FIG. 3, the film thickness of the low-density layer 2b must be approx. 0.1 $\mu$m or larger.

The above-mentioned results show that the thickness of the low-density layer 2b is preferably from approx. 0.1 $\mu$m to 0.6 $\mu$m, more preferably from approx. 0.1 $\mu$m to 0.5 $\mu$m.

As described above, in the semiconductor optical modulator device 100, because the clad layer 2 consists of the high-density layer 2a and the low-density layer 2b and the cathode electrode 7 is provided on the high-density layer 2a, the ohmic resistance of the cathode electrode 7 is reduced. In addition, because the InGaAsP light absorption layer 3 is in the vicinity of the low-density layer 2b, the light absorption loss thereof can be reduced. Therefore, using such a structure can provide the semiconductor optical modulator device 100 having the cathode electrode 7 with excellent ohmic characteristics and suppressing decrease in light intensity.

Figure 4A:
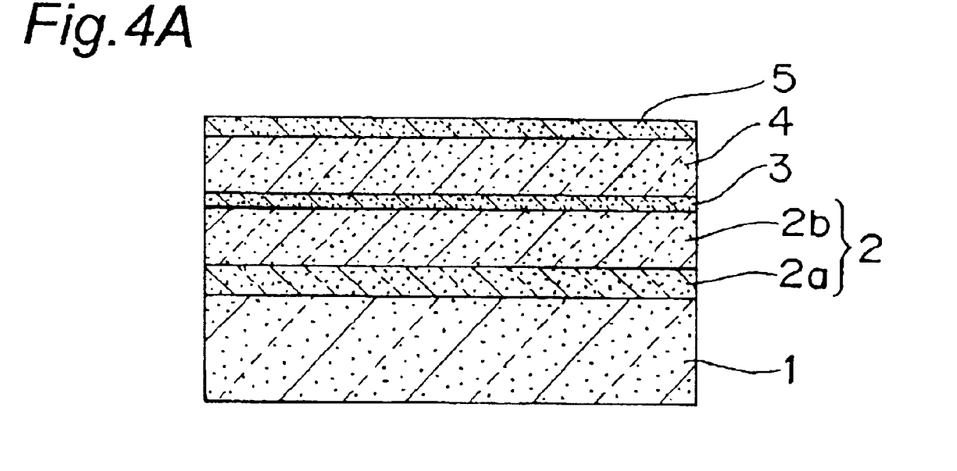
FIGS. 4A, 4B, and 4C are sectional views of a semiconductor optical modulator device in accordance with the first preferred embodiment of the present invention, showing a manufacturing process thereof.
Figure 4B:
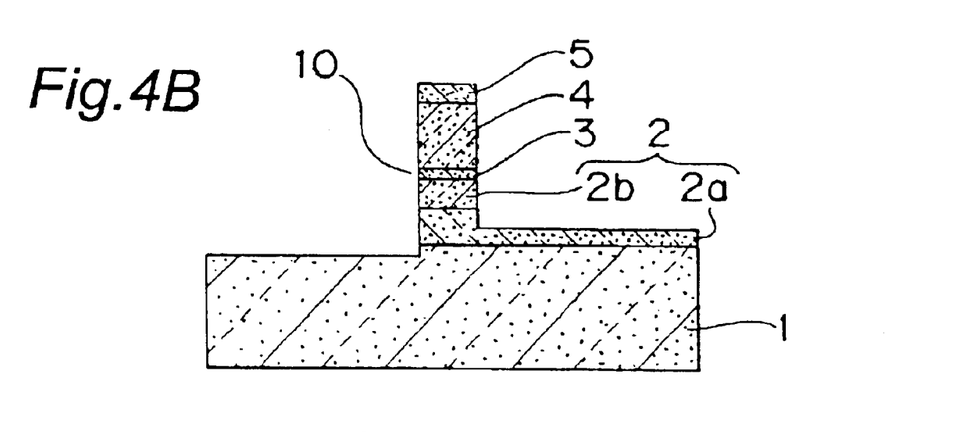
Figure 4C:
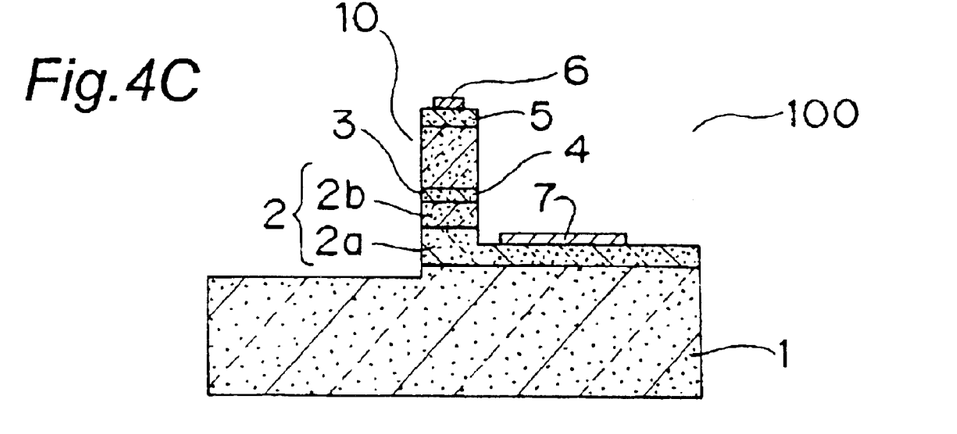

Next, a method of manufacturing the semiconductor optical modulator device 100 is described with reference to FIG. 4. FIG. 4 is a sectional view taken in the direction of the arrows along the line I—I in FIG. 1A. In FIG. 4, the same reference marks as those in FIGS. 1A and 1B refer to each identical or corresponding part.

In this manufacturing method, first, the semi-insulating substrate 1 made of InP is prepared. Next, sequentially formed thereon by organometallic vapor growth method, as shown in FIG. 4A, are the high-density layer 2a made of n-InP with high carrier density, the low-density layer 2b made of n-InP with low carrier density, the InGaAsP light absorption layer 3, the p-InP upper clad layer 4 and p-the InGaAs contact layer 5.

For example, the high-density layer 2a has a thickness of 1.5 $\mu$m, the low-density layer 2b, 0.3 $\mu$m, the light absorption layer 3, 0.3 $\mu$m, the upper clad layer 4, 1.5 $\mu$m, and the contact layer 5, 0.3 $\mu$m, respectively. Especially, the carrier density of the low-density layer 2b is $3 \times 10^{17}$ cm$^{-1}$ and that of the high-density layer 2a is $7 \times 10^{18}$ cm$^{-3}$.

The high-density layer 2a and the low-density layer 2b constitute the lower clad layer 2. The InGaAs light absorption layer 3 can be a layer of single composition or have a quantum well structure.

Next, as shown in FIG. 4B, an optical waveguide structure of a high mesa ridge type is formed by dry etching using a mixed gas of methane, oxygen and hydrogen. The width of the ridge 10 (the horizontal direction of the drawing) is approx. 2 $\mu$m and the height thereof (the vertical direction of the drawing) is approx. 2.5 $\mu$m.

At last, as shown in FIG. 4C, a resist mask (not shown) is formed, Ti/Au layers are formed by the electron-beam evaporation method, and the anode electrode 6 and the cathode electrode 7 are formed by the lift-off method. In the above-mentioned process, the semiconductor optical modulator device 100 of a high mesa ridge type with an optical waveguide structure as shown in FIG. 1 is completed.

Figure 5:
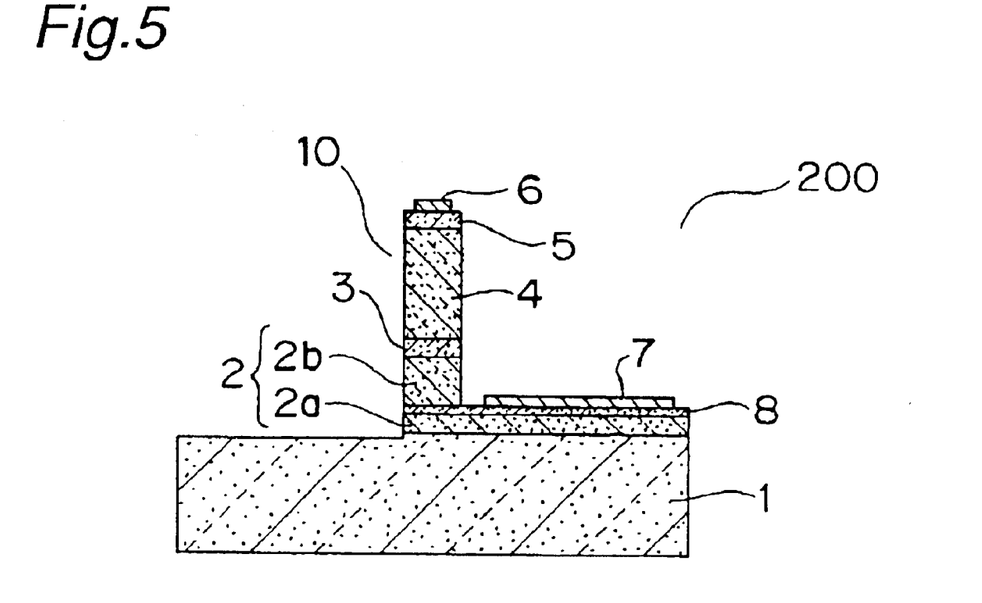
FIG. 5 is a sectional view of another semiconductor optical modulator device in accordance with the first preferred embodiment of the present invention.

FIG. 5 is a sectional view of another semiconductor optical modulator device in accordance with this embodiment, indicated in its entirety as 200. FIG. 5 is a sectional view taken in the same direction as the arrows along the line I—I in FIG. 1A. In FIG. 5, the same reference marks as those in FIGS. 1A and 1B refer to each identical or corresponding part.

In the semiconductor optical modulator device 200, an etching stopper layer 8 is provided between the high-density layer 2a and the low-density layer 2b, both constituting the lower clad layer 2. Other structure is the same as that of the semiconductor optical modulator device 100.

Used for the etching stopper layer 8 is a material with a high etching selection ratio especially with respect to the low-density layer 2b in the step of etching the ridge. In case of the semiconductor optical modulator device 200, the low-density layer 2b is made of InP. Thus, InGaAs or InAlAs, for example, is used for the etching stopper layer 8. Preferably, the carrier density of the etching stopper layer 8 is 1 to $3 \times 10^{18}$ cm$^{-3}$, same as that of the high-density layer 2a, because the etching stopper layer has the cathode electrode 7 thereon. Preferably, the film thickness of the etching stopper layer is 10 to 200 nm.

Interposing the etching stopper layer 8 made of InGaAsP or InAlAs in this manner improves controllability of the etching amount and production yield in the process of forming the ridge 10 using a mixed gas of methane, oxygen, and hydrogen. This can reduce the cost for the semiconductor optical modulator device 200.

Figure 6:
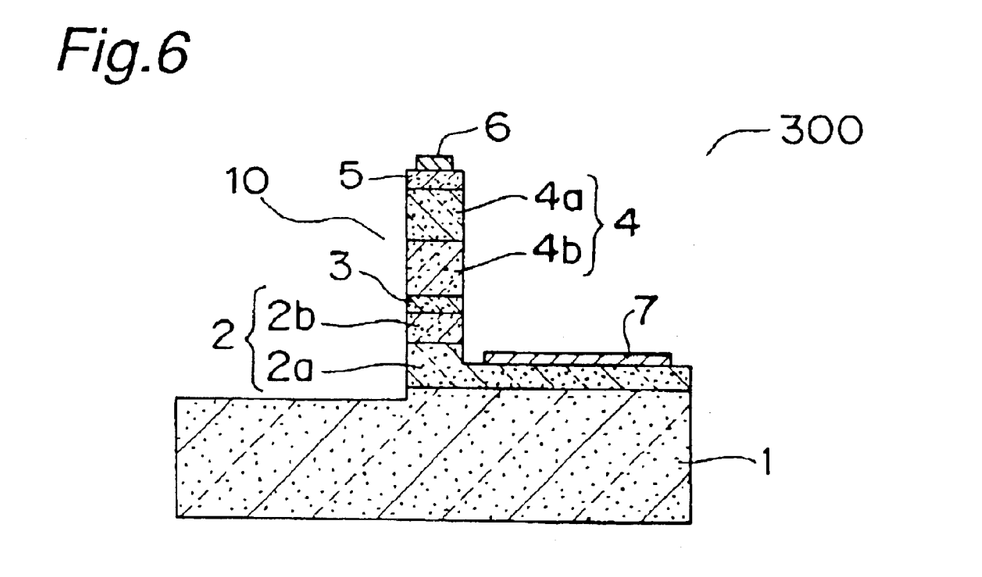
FIG. 6 is a sectional view of another semiconductor optical modulator device in accordance with the first preferred embodiment of the present invention.

FIG. 6 is a sectional view of another semiconductor optical modulator device in accordance with this embodiment, indicated in its entirety as 300. FIG. 6 is a sectional view taken in the same direction as the arrows along the line I—I in FIG. 1A. In FIG. 6, the same reference marks as those in FIGS. 1A and 1B refer to each identical or corresponding part.

In the semiconductor optical modulator device 300, like the lower clad layer 2, the upper clad layer 4 is made of an n-InP high-density layer 4a and an n-InP low-density layer 4b. Other structure is the same as that of the semiconductor optical modulator device 100.

The high-density layer 4a has a carrier density of $1 \times 10^{18}$ cm$^{-3}$, and a film thickness of 1.5 µm, for example. The low-density layer 4b has a carrier density of $3 \times 10^{10}$ cm$^{-3}$, and a film thickness of 0.3 µm, for example.

In the semiconductor optical modulator device 300, the clad layer 4 consists of the high-density layer 4a and the low-density layer 4b and the anode electrode 6 is provided on the high-density layer 4a, and thus the ohmic resistance of the anode electrode 6 is reduced. In addition, because the InGaP light absorption layer 3 is in the vicinity of the low-density layer 4b, the light absorption loss can be reduced.

Therefore, using such a structure can provide the semiconductor optical modulator device 300 having excellent ohmic characteristics of the anode electrode 6 and suppressing decrease in light intensity.

Preferred Embodiment 2

Figure 7:
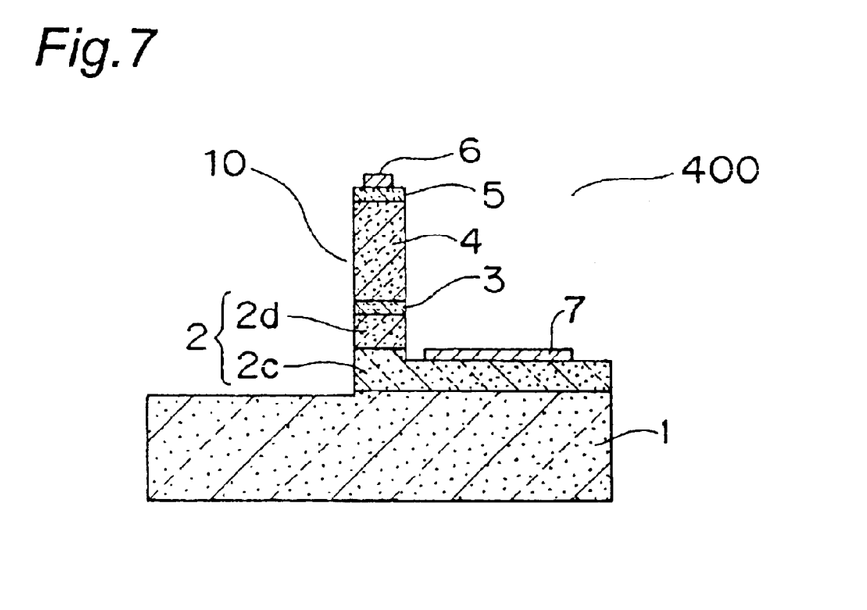
FIG. 7 is a sectional view of a semiconductor optical modulator device in accordance with a second preferred embodiment of the present invention.

FIG. 7 is a sectional view of a semiconductor optical modulator device in accordance with this embodiment, indicated in its entirety as 400. FIG. 7 is a sectional view taken in the same direction as the arrows along the line I—I in FIG. 1A. In FIG. 7, the same reference marks as those in FIGS. 1A and 1B refer to each identical or corresponding part.

In the semiconductor optical modulator device 400, the lower clad layer 2 consists of a narrow-gap layer 2c with small band gap energy and a wide-gap layer 2d with large band gap energy.

An n-InGaAsP layer is used for the narrow-gap layer 2c. Instead, n-InGaAs can also be used. Like Embodiment 1, an n-InP layer is used for the wide-gap layer 2d. Other structure is the same as that of the semiconductor optical modulator device 100.

In the semiconductor optical modulator device 400, the cathode electrode 7 is provided on the narrow-gap layer 2c with small band gap energy; and thus the resistance of the ohmic junction is reduced.

On the other hand, the lower clad layer 2 adjacent to InGaAsP light absorption layer 3 is the wide-gap layer 2d. Thus, the band gap thereof is large and the light absorption loss in the wide-gap layer 2d is reduced Therefore, in the semiconductor optical modulator device 400, the cathode electrode thereof has excellent ohmic characteristics and decrease in light intensity can be prevented.

Preferred Embodiment 3

Figure 8:
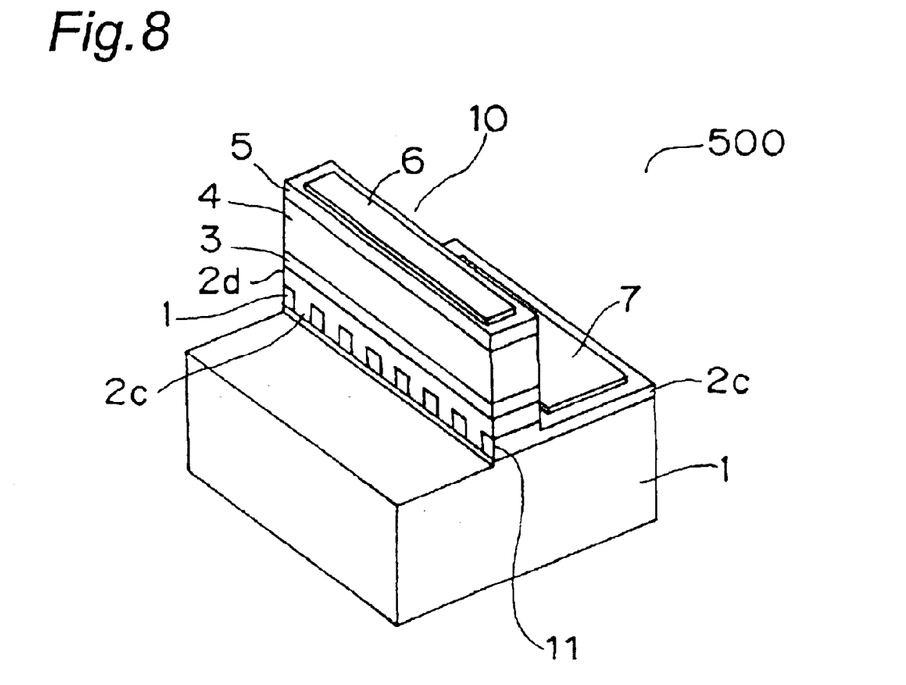
FIG. 8 is a perspective view of a semiconductor optical modulator device in accordance with a third preferred embodiment of the present invention.

FIG. 8 is a perspective view of a semiconductor optical modulator device in accordance with this embodiment, indicated in its entirety as 500. In FIG. 8, the same reference marks as those in FIG. 7 refer to each identical or corresponding part.

In the semiconductor optical modulator device 500, the narrow-gap layer 2c and the wide-gap layer 2d, both constituting the lower clad layer 2, form a diffraction grating 11. As shown in FIG. 8, the diffraction grating 11 is formed of a repetition structure in the longitudinal direction of the ridge 10 (the travelling direction of light). This structure improves the transmission efficiency of light with Bragg wavelength.

Specifically, the diffraction grating 11 is formed of a repetition structure of InGaAsP (the narrow-gap layer 2c) and InP (the wide-gap layer 2d). The pitch of the diffraction grating (grating space) is set to substantially a half of the wavelength of light entering into the semiconductor optical modulator device 500 (the wavelength in the waveguide). For example, when light with a wavelength of 1.55 µm enters into the semiconductor optical modulator device 500 and is modulated therein, the pitch of the diffraction grating 11 is approx. 2400 Å. Setting the pitch of the diffraction grating 11 in this manner improves the propagation characteristic of light with a wavelength of approx. 1.55 µm and can reduce the light propagation loss.

The diffraction grating 11 is produced by the following steps: forming a predetermined pitch of asperities in the area to form the ridge on the narrow-gap layer 2c by using photolithography and etching processes; depositing the wide-gap layer 2d and other layers by the organometallic vapor growth method; and forming the ridge 10 in the same manner shown in Embodiment 1.

As mentioned above, in the semiconductor optical modulator device 500, providing the diffraction grating 11 in the lower clad layer 2 can suppress the light propagation loss, resulting in a semiconductor optical modulator device with little loss.

Figure 9:
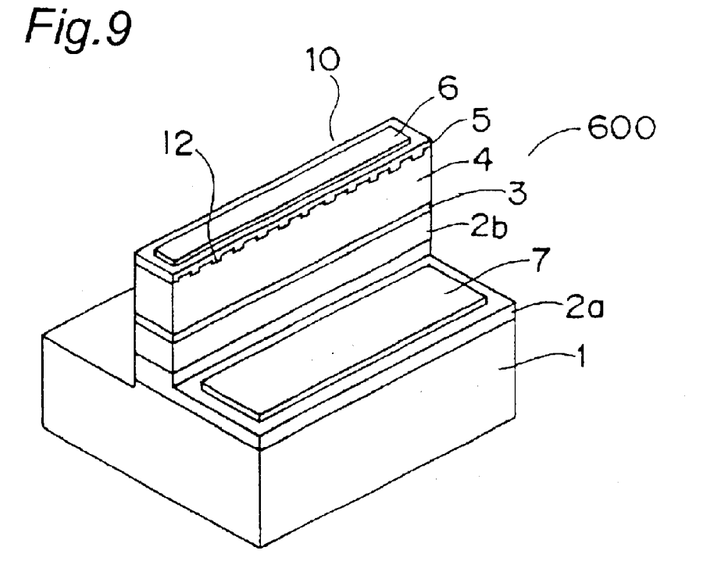
FIG. 9 is a perspective view of another semiconductor optical modulator device in accordance with the third preferred embodiment of the present invention.

FIG. 9 illustrates another semiconductor optical modulator device in accordance with this embodiment, indicated in its entirety as 600.

In the semiconductor optical modulator device 600, a diffraction grating 12 is formed between the upper clad layer 4 and the contact layer 5. The diffraction grating 12 is formed of a repetition structure of InP (the upper clad layer 4) and InGaAs (the contact layer 5) along the longitudinal direction of the ridge 10. The pitch of the diffraction grating is made to substantially a half of the wavelength of light entering into the semiconductor optical modulator device 600.

In the semiconductor optical modulator device 600, the diffraction grating 12 is formed above the light absorption layer 3 thereby to suppress the light propagation loss, resulting in a semiconductor optical modulator device with little loss.

In the semiconductor optical modulator devices described in the above embodiments, the conductive type of the semiconductor layer (p-type or n-type) can be inverted. While the light absorption layer 3 is made of InGaAsP in Preferred Embodiments 1 to 3, InGaAlAs can also be used for the light absorption layer.

While the InP substrate is used in Preferred Embodiments 1 to 3, GaAs semi-insulating substrate can be used as the substrate, AlGaAs or GaAs layer as the clad layer, and AlGaAs/GaAs layer as the light absorption layer, respectively.

In Preferred Embodiments 1 to 3, semiconductor optical modulator devices are described. However, the present invention can also be applied to such receiving optics as a waveguide type photo detector. In addition, the structures in accordance with Preferred Embodiments 1 and 2 can be applied to such a light-emitting device as a laser diode.

What is claimed is:

1. A waveguide semiconductor optical device with a mesa ridge structure comprising:

a semi-insulating substrate; and a ridge on the semi-insulating substrate, comprising a lower cladding layer, a core layer, and an upper cladding layer sequentially laminated on the semi-insulating substrate, wherein the lower cladding layer comprises a first layer laterally extending from the ridge and having an electrode on a top face, and a second layer with a charge carrier density lower than that of the first layer and in contact with the core layer.

2. The semiconductor optical device according to claim 1, wherein the carrier density of the first layer ranges from about $7 \times 10^{18}$ cm$^{-3}$ to about $1 \times 10^{19}$ cm$^{-3}$, and the carrier density of the second layer ranges from about $1 \times 10^{17}$ cm$^{-3}$ to about $3 \times 10^{17}$ cm$^{-3}$.

3. A waveguide semiconductor optical device with a mesa ridge structure comprising:

a semi-insulating substrate; and a ridge on the semi-insulating substrate, comprising a lower cladding layer, a core layer, and an upper cladding layer sequentially laminated on the semi-insulating substrate, wherein the upper cladding layer comprises a first layer in contact with the core layer and a second layer with a charge carrier density higher than that of the first layer.

4. The semiconductor optical device according to claim 3, wherein the carrier density of the second layer ranges from about $7 \times 10^{18}$ cm$^{-3}$ to about $1 \times 10^{19}$ cm$^{-3}$, and the carrier density of the first layer ranges from about $1 \times 10^{17}$ cm$^{-3}$ to about $3 \times 10^{17}$ cm$^{-3}$.

5. A waveguide semiconductor optical device with a mesa ridge structure comprising:

a semi-insulating substrate; and a ridge on the semi-insulating substrate, comprising a lower cladding layer, a core layer, and an upper cladding layer sequentially laminated on the semi-insulating substrate, wherein the lower cladding layer comprises a first layer laterally extending from the ridge and having an electrode on a top face, and a second layer having a band gap energy larger than that of the first layer and in contact with the core layer.

6. The semiconductor optical device according to claim 5 wherein the device comprises a diffraction grating including a plurality of repeating the first and second layers repeating in a longitudinal direction of the ridge along an interface between the first layer and the second layer.

7. The semiconductor optical device according to claim 6 wherein a pitch of the diffraction grating is substantially one half of a wavelength of light passing through the core layer.

* * * * *